(12) United States Patent
Chen et al.

(10) Patent No.: US 12,555,747 B2
(45) Date of Patent: Feb. 17, 2026

(54) METHODS AND SYSTEMS FOR DRY ETCHING

(71) Applicant: Taiwan Semiconductor Manufacturing Company, Hsinchu (TW)

(72) Inventors: Chien-Liang Chen, New Taipei (TW); Shao-Chien Hsu, Hsinchu (TW); Jung-Wang Lu, Taipei (TW); Meng-Chang Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 448 days.

(21) Appl. No.: 17/856,901

(22) Filed: Jul. 1, 2022

(65) Prior Publication Data
US 2024/0006157 A1 Jan. 4, 2024

(51) Int. Cl.
*H01J 37/32* (2006.01)
*H01L 21/3213* (2006.01)

(52) U.S. Cl.
CPC .. *H01J 37/32357* (2013.01); *H01J 37/32422* (2013.01); *H01L 21/32136* (2013.01); *H01L 21/32139* (2013.01); *H01J 2237/3343* (2013.01)

(58) Field of Classification Search
None
See application file for complete search history.

(56) References Cited

U.S. PATENT DOCUMENTS

| | | | | |
|---|---|---|---|---|
| 5,968,275 A * | 10/1999 | Lee | ................... | H01L 21/31138 438/731 |
| 6,113,700 A * | 9/2000 | Choi | ................. | H01L 21/67017 156/345.34 |
| 6,537,419 B1 * | 3/2003 | Kinnard | ............ | C23C 16/45565 156/345.47 |
| D641,829 S * | 7/2011 | Angelov | ...................... | D23/213 |
| 8,470,127 B2 * | 6/2013 | De La Llera | ..... | H01J 37/32532 156/345.43 |
| 8,702,866 B2 * | 4/2014 | Augustino | ........ | C23C 16/45565 156/345.43 |
| 10,665,448 B2 * | 5/2020 | Yokogawa | ........ | H01L 21/02002 |
| 12,130,561 B2 * | 10/2024 | Ramaswamy | ............ | G03F 7/42 |

(Continued)

FOREIGN PATENT DOCUMENTS

WO    WO-9859367 A1 * 12/1998 ........ H01J 37/32633

*Primary Examiner* — Sylvia Macarthur
(74) *Attorney, Agent, or Firm* — Lippes Mathias LLP

(57) ABSTRACT

Methods and systems for dry etching are disclosed. The methods and systems use a showerhead with a perforated plate. The perforated plate includes a primary solid zone having no holes; a first annular zone comprising a first plurality of holes with a first total hole area; a secondary solid zone having no holes; a second annular zone comprising a second plurality of holes with a second total hole area; a third annular zone comprising a third plurality of holes with a third total hole area; and a fourth annular zone comprising a fourth plurality of holes with a fourth total hole area. The third total hole area is greater than the first total hole area and less than the second total hole area, and the fourth total hole area is greater than the second total hole area. Dry etched wafers using these systems have improved edge uniformity and improved yield.

20 Claims, 7 Drawing Sheets

(56) References Cited

U.S. PATENT DOCUMENTS

| | | | |
|---|---|---|---|
| 2003/0010452 A1* | 1/2003 | Park | C23C 16/45565 156/345.33 |
| 2004/0060661 A1* | 4/2004 | Nishimoto | H01J 37/32009 156/345.43 |
| 2005/0056218 A1* | 3/2005 | Sun | C30B 35/00 118/715 |
| 2009/0179085 A1* | 7/2009 | Carducci | C23C 16/45565 239/289 |
| 2012/0031559 A1* | 2/2012 | Dhindsa | H01L 21/67069 156/345.33 |
| 2013/0319612 A1* | 12/2013 | Su | C23C 16/50 427/9 |
| 2014/0273490 A1* | 9/2014 | Mao | H01L 21/0335 438/717 |
| 2015/0214013 A1* | 7/2015 | Glukhoy | H01J 37/32477 29/527.1 |
| 2015/0221479 A1* | 8/2015 | Chen | H01J 37/32422 118/723 MP |
| 2020/0216957 A1* | 7/2020 | Joo | H01J 37/32449 |
| 2024/0006157 A1* | 1/2024 | Chen | H01L 21/32139 |

* cited by examiner

METHODS AND SYSTEMS FOR DRY ETCHING

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device. Plasma treatment is used for various applications in the integrated circuit production process, such as cleaning the wafer or for etching.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
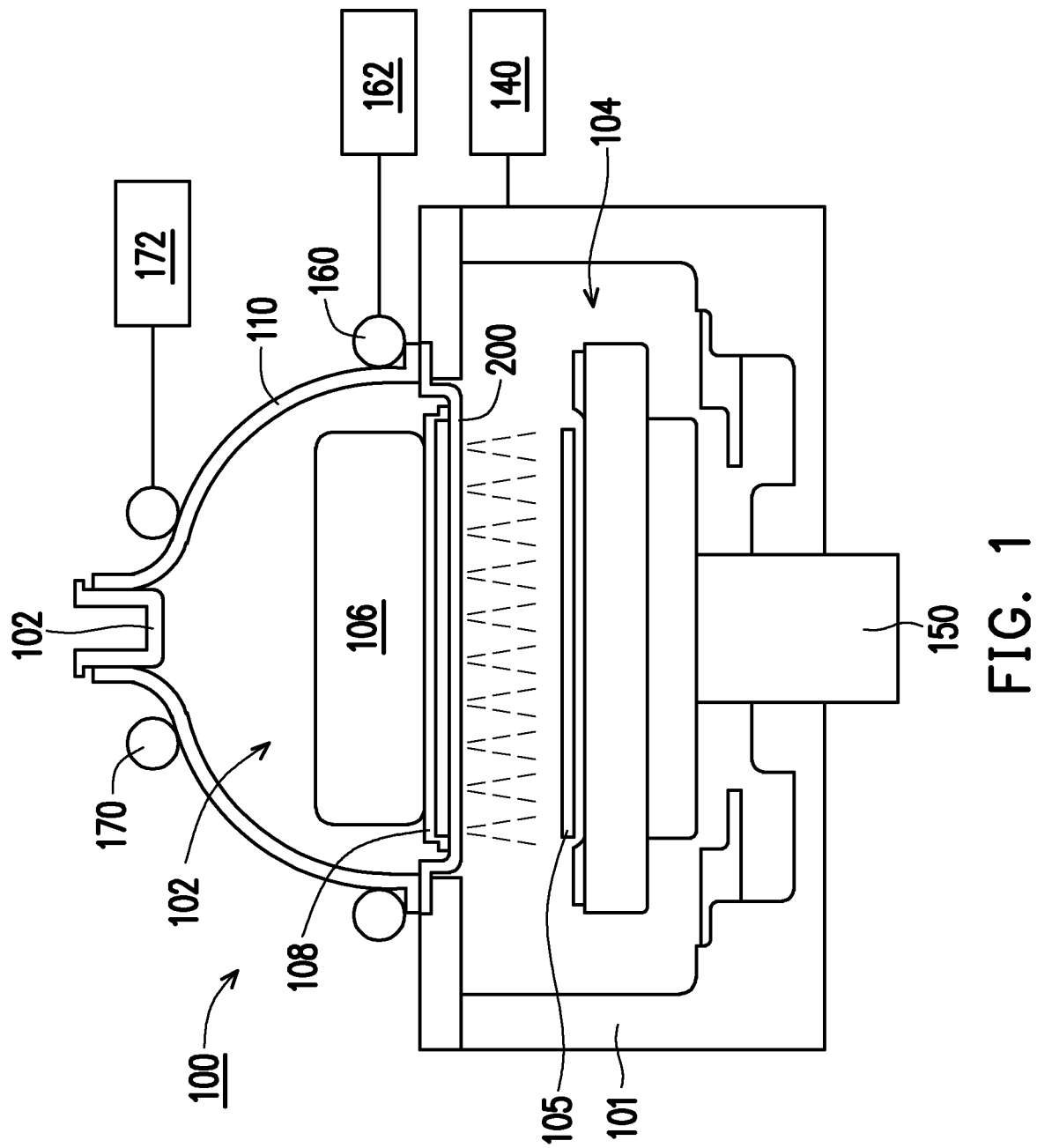
FIG. 1 is a cross-sectional schematic diagram of an example plasma treatment systems suitable for dry etching in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure relates to devices and methods for performing dry etching, for example via plasma treatment. Plasma treatment and plasma treatment tools are commonly used in integrated circuit fabrication processes. Those manufacturing steps and applications can include the cleaning of wafer substrates, etching processes, and wafer bonding processes such as fusion bonding. Very generally, plasma is produced by applying a radiofrequency (RF) electromagnetic field through a gas between two electrodes. The RF field ionizes the gas molecules and strips them of their electrons, creating a plasma. The ions bombard the wafer substrate, resulting in the desired functions. In certain etchers that use inductively coupled plasma (ICP) or transformer-coupled plasma (TCP), the electrode(s) is separated from the plasma by a dielectric window.

In conventional semiconductor manufacturing processes, the results of the dry etch process suffer from poor etch rate uniformity over the surface of the wafer substrate. This results in polymer residues being left on the edges and polysilicon defects, which can damage the integrated circuits and/or semiconductor chips located along the edge of the wafer substrate. This further impact wafer acceptance testing (WAT)/chip probing (CP) yield.

The plasma treatment systems and methods include a plasma generation chamber and a plasma treatment chamber. A feed gas is fed into the plasma generation chamber through an inlet. The gas molecules are then ionized to produce a plasma. The plasma passes through a showerhead to bombard a wafer substrate located in the plasma treatment chamber. The showerhead includes a hole distribution design which optimizes the distribution of the plasma, improving the etch rate uniformity over the surface of the wafer substrate. Improved critical dimension/depth uniformity is obtained due to decreased defects along the edge/perimeter of the wafer substrate. This improves overall yield of the wafer substrate.

FIG. 1 is a side cross-sectional schematic diagram of an example plasma treatment system 100 in accordance with some embodiments of the present disclosure.

Generally, the system 100 includes a housing 101 that contains a plasma generating chamber 102 and a plasma treatment chamber 104. The plasma generating chamber is located over or above the plasma treatment chamber. A plasma sheath 106 is generated within the plasma generating chamber 102. Optionally, the plasma is filtered through an ion filter 108. The (optionally filtered) plasma then flows through a showerhead 200 into the plasma treatment chamber 104. The showerhead 200 aids in producing a uniform distribution of the plasma over the surface of a semiconducting wafer substrate 105. The substrate is supported on a pedestal 150 within the plasma treatment chamber 104.

In some embodiments not illustrated herein, a cooling chamber is located over or above the plasma generating chamber. In this regard, the plasma may cause large temperature variations across the components of the plasma generating chamber, such as the dome 110. This may cause undesirable deposition of materials, or cracking of such components. The cooling chamber may be used to reduce such temperature variations, or in other words to increase the uniformity of temperatures across the plasma generating chamber.

As illustrated here, the top of the plasma generating chamber 102 is a dome 110. A lower electrode 160 is located near the bottom of the dome, and an upper electrode 170 is located near the top of the dome. The electrodes may be, for example, in the shape of a planar coil. The electrodes are used to provide energy for ionizing gas molecules so as to generate a plasma. Radiofrequency (RF) generators are present for applying RF power. A lower RF generator 162 is coupled to the lower electrode 160, and an upper RF generator 172 is coupled to the upper electrode 170.

The dome 110 may be made of a material that is configured to transmit RF energy, or in other words the dome is generally transparent to RF. This permits transmission of an RF induction field through the dome. Thus, the dome desirably has a low impedance to the RF induction field or has an electric field susceptibility sufficiently low to transmit the induction field through the dome with minimal power loss. A suitable composition for the dome has high transmittance (i.e., low loss tangent) across RF frequencies. If RF transmittance is low, energy may undesirably be absorbed and converted into excessive heat. Such heat may both degrade the plasma generation process due to lost RF energy while also causing excessive heating of components and the creation of thermal gradients. The dome material should also resist erosion from the plasma.

In some embodiments, the dome 110 is made of a ceramic material. Non-limiting examples of ceramic materials that can be used to make the dome include silicon, silicon dioxide ($SiO_2$), silicon carbide, alumina ($Al_2O_3$), germanium, Group III-V compound semiconductors such as gallium arsenide and indium phosphide, and Group II-II-V compound semiconductors such as mercury cadmium-telluride. In some specific embodiments, the dome is made from silicon dioxide ($SiO_2$) or alumina ($Al_2O_3$).

A diffuser 102 is also present at the top of the dome, through which process gases are introduced into the plasma generating chamber 102. The diffuser may be connected to gas sources (not shown) for providing the specified gas.

The plasma contains charged ions. Prior to flowing through the showerhead 200, the plasma may flow through an ion filter 108. The ion filter may be used to change the relative concentration of ionic species which pass into the plasma treatment chamber. For example, the ion filter may be formed from a set of electrically conductive wire grids having openings through which the ionic species can pass. The wire grids are electrically biased by a power supply to cause positively charged ionic species to be accelerated towards and through the wire grids into the plasma treatment center. Alternatively, the wire grids may be biased to repel negatively charged ionic species. The ion filter can be used as a control point to set the kinetic energy and ion filtration characteristics of the ionic species within the plasma that enters the plasma treatment chamber.

For example, the ion filter may be made from elemental aluminum (Al) or an aluminum alloy. The ion filter may be coated. In some embodiments, the coating may contain yttrium. Some non-limiting examples of yttrium-containing materials suitable for the coating include yttrium fluoride ($YF_3$), yttrium oxyfluoride (YOF), and yttrium aluminum garnet ($Y_3Al_5O_{12}$).

Referring now to the plasma treatment chamber 106, a wafer support pedestal 150 is present within the housing. The pedestal may be configured to hold a semiconductor wafer substrate 105 in a desired position. The pedestal includes a support surface which contacts the wafer substrate. The support surface itself is usually made of an electrically insulating material.

In particular embodiments, the pedestal is in the form of an electrostatic chuck that uses an electrostatic holding force to secure the wafer substrate. The pedestal may include a chuck electrode located below the support surface. Extending through the chuck electrode and the support surface are loading pins, which can be used to raise and lower the wafer substrate. In some embodiments, channels may be provided on the back side of the electrostatic chuck for providing gases or fluids to cool the wafer substrate during plasma treatment. In this way, warpage and/or other damage to the wafer substrate may be reduced or minimized.

Alternatively, the pedestal may apply vacuum pressure to hold the wafer substrate in place by suction. As yet another alternative, the pedestal may interact mechanically, for example using clamps or retaining rings or the like, to hold the wafer substrate in place using a mechanical holding force.

A focus ring may also be present around the wafer support surface of the pedestal. The focus ring is designed to improve etch uniformity around the wafer edge or perimeter, by permitting the plasma to extend beyond the wafer perimeter. The focus ring is typically made of an insulating material, e.g. quartz, and is a consumable part that is periodically replaced.

One or more gas outlets may also present for removing undesired gases, and for reducing the pressure within the plasma treatment chamber. A gas outlet can be connected to a pump (not shown) for creating vacuum. A door (not shown) is also present for accessing the plasma treatment chamber to insert and remove the wafer substrate, which can be done using an automated material handling system (AMHS).

A controller 140 can be used to control the various inputs and outputs, and to measure various conditions within the housing for both the plasma generating process and the plasma treatment process. The system may also include sensors (not shown) for monitoring applicable parameters. For example, such sensors may include those for tracking the flow rate of various gases, for measuring the content of gases exiting the plasma treatment chamber, for measuring the pressure within the plasma treatment chamber, the temperature of the wafer substrate, the temperature of the inlet gas, the temperature of the dome, etc. The controller can also determine whether to activate or deactivate the system, how to vary the voltage to the electrodes, how to vary the gas mixture, how fast/strongly the gas should flow into the plasma generating chamber, and potentially also control the motion of any automated material handling system that may be present, etc. It is noted that these various parameters may not have to be held steady during operation, and could be changed by the controller operating a computer program which alters their setpoints as appropriate. The controller may also include a user interface for communicating with operators. If desired, different controllers may be used for controlling the plasma generating chamber and the plasma treatment chamber.

The controller may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

The various components of the plasma treatment system may be made using materials and processes known in the art. Examples of suitable materials can include metals, plastics, etc. Common enhancements may also be used. For example, the various surfaces within the plasma treatment chamber may include a protective coating.

Figure 2A:
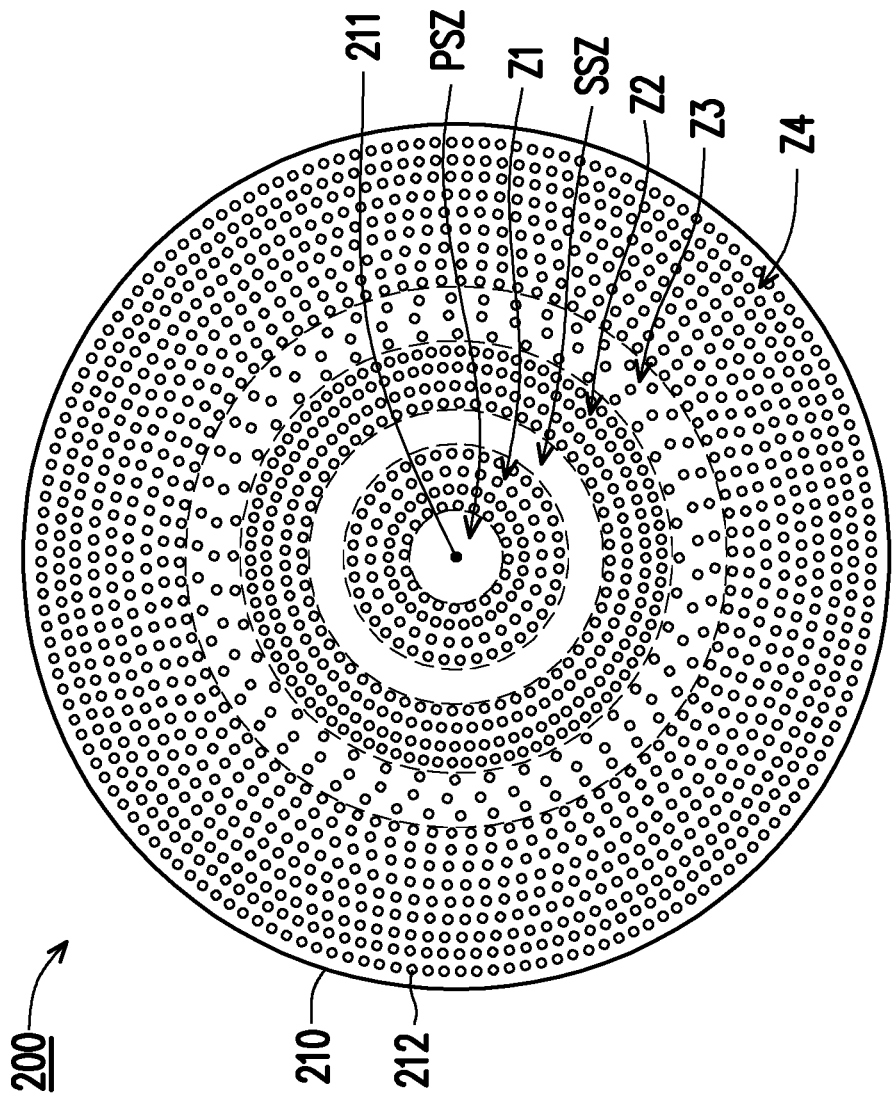
FIG. 2A is a first view of the bottom surface of a showerhead in accordance with some embodiments of the present disclosure.
Figure 2B:
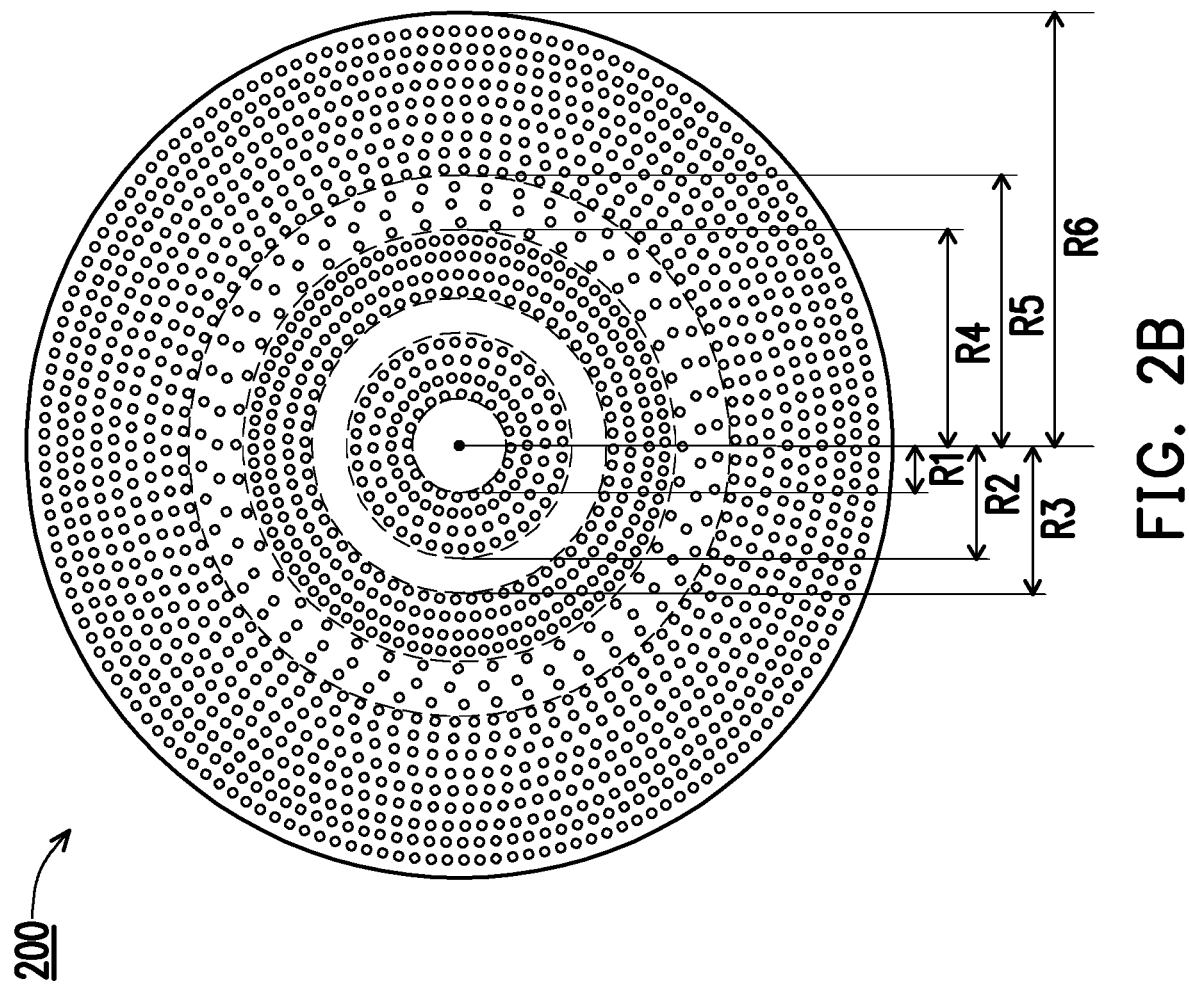
FIG. 2B is a second view of the bottom surface of a showerhead, showing additional features.
Figure 2C:
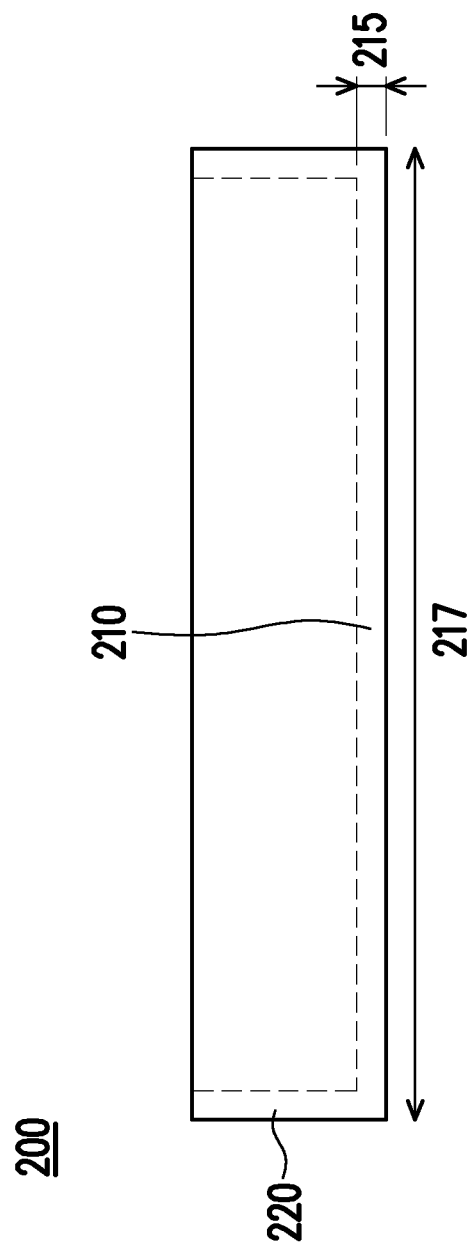
FIG. 2C is a side view of the showerhead.

FIGS. 2A-2C are various views of the showerhead 200 which separates the plasma generating chamber from the plasma treatment chamber. FIG. 2A and FIG. 2B are views of the lower surface of the perforated plate 201 of the showerhead, in accordance with some embodiments of the present disclosure. FIG. 2C is a side view of the showerhead.

Referring first to FIG. 2A, the showerhead includes a perforated plate 210. The perforated plate is generally circular. The perforated plate 210 generally includes six concentric zones with different hole configurations. Starting at the center 211 of the plate and moving sequentially and radially outwards from the center, these six zones include a primary solid zone PSZ, a first annular zone Z1, a secondary solid zone SSZ, a second annular zone Z2, a third annular zone Z3, and a fourth annular zone Z4. Each zone is indicated within a set of dashed lines. Here, the primary solid zone has a circular shape, while the other five zones have an annular shape.

The primary solid zone and the secondary solid zone do not have any holes, or put another way the plasma cannot pass through these two solid zones. In particular embodiments, the primary solid zone may have a total area of about 300 mm$^2$ to about 900 mm$^2$. The secondary solid zone may have a total area of about 1100 mm$^2$ to about 2800 mm$^2$. In particular embodiments, when the areas of these two solid zones are added together, the total area of the primary solid zone and the secondary solid zone is less than about 3550 mm$^2$.

In contrast, the four annular zones Z1, Z2, Z3, Z4 have holes 212 which extend through the perforated plate from one surface to the other surface, creating passages through which the plasma can pass. The first annular zone comprises a first plurality of holes with a first total hole area. The first total hole area is the sum of the areas of all of the holes in the first annular zone. Similarly, the second annular zone comprises a second plurality of holes with a second total hole area. The third annular zone comprises a third plurality of holes with a third total hole area. The fourth annular zone comprises a fourth plurality of holes with a fourth total hole area.

In particular embodiments, the third total hole area is greater than the first total hole area. The third total hole area is also less than the second total hole area. The fourth total hole area is greater than the second total hole area. Thus, with respect to their total hole area, Z1<Z3<Z2<Z4. In some further embodiments, the total hole area of the perforated plate is less than about 42,400 mm$^2$.

In particular embodiments, the first annular zone may have a total area of 1400 mm$^2$ to about 3600 mm$^2$. The second annular zone may have a total area of about 4400 mm$^2$ to about 10700 mm$^2$. The third annular zone may have a total area of about 3300 mm$^2$ to about 8000 mm$^2$. The fourth annular zone may have a total area of about 15500 mm$^2$ to about 37400 mm$^2$.

Generally, the holes in the perforated plate have a diameter of about 0.5 mm to about 13 mm (i.e. a radius of about 0.25 mm to about 6.5 mm). Although their diameters may vary, it is contemplated that in some specific embodiments, all of the holes in the same annular zone have the same diameter. In some further embodiments, all of the gas distribution holes in the perforated plate have the same diameter. Generally, the distance between adjacent holes is at least 0.1 mm. The number of holes and their locations may vary between the annular zones. This may depend on factors such as the diameter of the holes and the distance between adjacent holes. They are usually circular, but other shapes could be used if desired. The holes within a given annular zone are generally uniformly distributed around the given annular zone. Put another way, if a given annular zone was divided into multiple annular sectors of equal area, the hole area in each annular sector would be about equal to the hole area of any other annular sector.

The showerhead of the present disclosure can alternatively be described in terms of hole percentages in the various annular zones. A hole percentage for each annular zone Z1, Z2, Z3, Z4 can be defined as the ratio of the total hole area (i.e. the area of all holes in the annular zone) divided by the total area of the annular zone. In particular embodiments, a first hole percentage of the first annular zone may be from about 7% to about 11%. A second hole percentage of the second annular zone may be from about 15% to about 24%. A third hole percentage of the third annular zone may be from about 9% to about 14%. A fourth hole percentage of the fourth annular zone may be from about 49% to about 69%. The number of holes may be varied to obtain these hole percentages. In some particular embodiments, the third hole percentage is the smallest of all four hole percentages, or in other words is less than the first hole percentage, the second hole percentage, and the fourth hole percentage. These values for the hole percentages cause the plasma to be preferentially concentrated along the edge of the wafer so that the etch rate across the entire wafer surface is more uniform.

Referring now to FIG. 2B, the primary solid zone has an outer radius R1. The outer radius R1 may be from about 3 millimeters (mm) to about 38 millimeters. The first annular zone has an inner radius R1 and an outer radius R2. The outer radius R2 may be from about 35 mm to about 53 millimeters. The secondary solid zone has an inner radius R2 and an outer radius R3. The outer radius R3 may be from about 45 mm to about 68 mm. The second annular zone has an inner radius R3 and an outer radius R4. The outer radius R4 may be from about 65 mm to about 98 mm. The third annular zone has an inner radius R4 and outer radius R5. The outer radius R5 may be from about 80 mm to about 120 mm. The third annular zone has an inner radius R5 and outer radius R6. The outer radius R6 may be from about 110 mm to about 150. R6 is greater than R5. R5 is greater than R4. R4 is greater than R3. R3 is greater than R2.

The showerhead may be secured to the housing using one or more fasteners, such as screws. Holes for such fasteners may be present in the perforated plate, or alternatively tabs (not shown) may be present extending from the perforated plate in which the fastening holes are located.

Referring now to FIG. 2C, the outer sidewall 220 of the showerhead is more visible. The outer sidewall extends normal (i.e. perpendicular) to the perforated plate 210. The outer sidewall is present around the circumference or perimeter of the perforated plate. The thickness of the perforated plate is indicated with reference numeral 215. In particular embodiments, the thickness of the perforated plate may be from about 10 mm to about 200 mm, as desired. The outer sidewall may have the same thickness as the perforated plate. The perforated plate has a diameter 217 which in particular embodiments is from about 220 mm to about 300 mm.

Although discussed separately, the showerhead 200 is generally made with the outer sidewall 220 and the perforated plate 210 as one integrated component, as a unitary or single structure. The showerhead 200 may be made of a metal material or a ceramic material. For example, the metal material may be elemental aluminum (Al) or an aluminum alloy. In some embodiments, the ceramic material may include aluminum oxide ($Al_2O_3$) bulk yttrium, or yttrium oxide ($Y_2O_3$).

The surfaces of the showerhead 200 may be coated with a coating. For example, the coating may be a perfluoroalkoxy (PFA) coating or an yttrium-containing coating. The yttrium-containing coating may be selected from the group consisting of yttrium fluoride ($YF_3$), yttrium oxyfluoride (YOF), and yttrium aluminum garnet ($Y_3Al_5O_{12}$).

Figure 3:
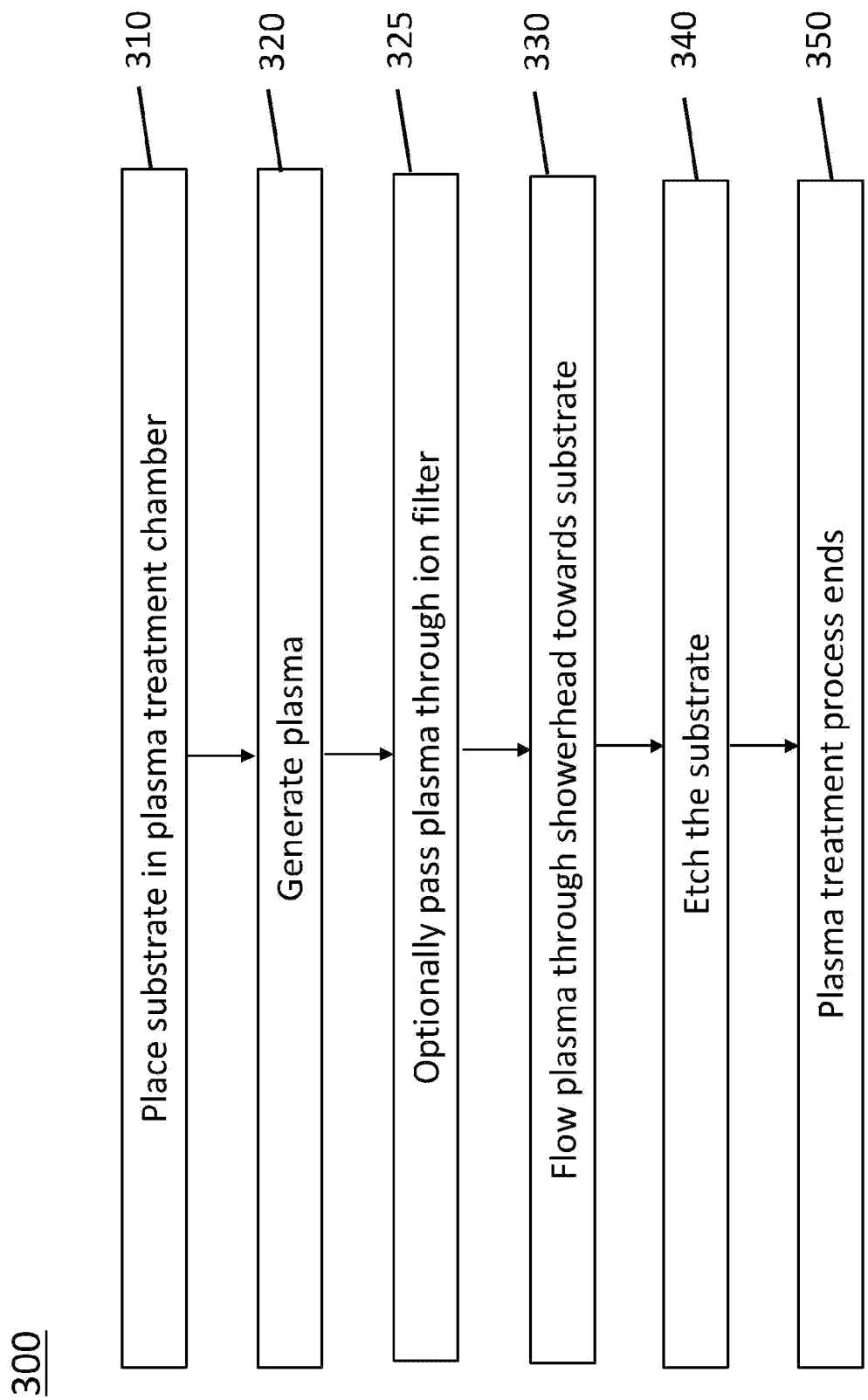
FIG. 3 is a flow chart illustrating a plasma treatment method in accordance with some embodiments of the present disclosure.

FIG. 3 is a flowchart illustrating a plasma treatment method 300, according to some embodiments of the present disclosure. Reference is also made back to FIG. 1.

In step 310, a semiconducting wafer substrate 105 is placed in the plasma treatment chamber, for example upon the support pedestal 150.

When used for production, the wafer substrate itself can be a wafer made of any semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), indium arsenide (InAs), and indium phosphide (InP).

Next, in step 320, the plasma is generated in the plasma generating chamber. Voltage provided by the RF generators is applied between the upper electrode 162 and the lower electrode 160 to ignite and sustain a plasma 106. The frequency is usually operated at 13.56 MHz, although other frequencies such as 2 MHz or 60 MHz may be used, depending on the application. The power used to generate the plasma may range from about 10 watts (W) to about 2,000 W. Once ignited, the plasma can be sustained by electric currents produced by electromagnetic induction associated with time-varying magnetic fields, or can become self-sustaining.

The process gas(es) used to generate the plasma enters through the diffuser 120. Depending on the application, for example, the process gases may include nitrogen ($N_2$), hydrogen ($H_2$), argon (Ar), helium ($H_2$), fluorine ($F_2$), chlorine ($Cl_2$), oxygen ($O_2$), hydrogen bromide (HBr), hydrofluoric acid (HF), nitrogen trifluoride ($NF_3$), or sulfur hexafluoride ($SF_6$), or hydrofluorocarbons of the general formula $C_xH_yF_z$.

In optional step 325, the generated plasma passes through an ion filter 108. As previously discussed, the ion filter can be used to further accelerate positive/negative species towards the wafer substrate, or to reduce or prevent the amount of negative/positive species that are directed towards the wafer substrate. This desirably increases the concentration of desired ionic species and reduces the concentration of undesired ionic species that are used in the dry etch process.

In step 330, the optionally filtered plasma flows through the showerhead towards the wafer substrate. Next, in step 340, the wafer substrate is dry etched, and in particular embodiments is plasma etched. The plasma treatment can be performed, for example, as part of a dielectric barrier discharge (DBD) process, a reactive ion etching (RIE) process, or a sequential plasma (SPAB) process.

In some embodiments, the plasma treatment is performed in a vacuum environment, for example with the pressure within the housing being from about 0.1 pascals (Pa) to about 100 Pa. However, the pressure may be higher and could simply be sub-atmospheric, for example a pressure of about 10 kPa to about 95 kPa (for comparison, atmospheric pressure is about 101 kPa). Ideally, the temperature in the plasma treatment chamber above the wafer substrate is in the range of about 70° C. to about 80° C.

In step 350, the plasma treatment process ends. Loading pins present in the support pedestal may then be raised to elevate the wafer substrate above the wafer support surface and to dissipate any residual charge that might be present on the wafer substrate. Automated handling tools (not shown) can then grasp the wafer substrate for transport to a subsequent processing tool for additional processing. Such processing may include further etching, deposition, testing, etc.

The plasma treatment system or tool can be used for performing dry etching. Dry etching can be used to form trenches and/or vias in a layer, and is a highly anisotropic process for obtaining high aspect ratios (i.e. predominantly vertical walls). For dry etching, for example, a patterned photoresist layer is present over a metal layer on the wafer substrate. The plasma treatment tool is then used to etch the exposed metal. Etch products may include for example, FCN, $CO_x$, $SiCl_x$, and/or $SiF_x$.

In particular embodiments, the plasma treatment system/tool is used for patterning of aluminum-copper (AlCu) alloy thin films. AlCu alloy is widely used as a very large-scale integration (VLSI) interconnection metal for semiconductor devices due to its high conductivity, good ductility, and good adhesion to the underlying substrate. The patterning of AlCu is commonly done using reactive ion etching (RIE). Suitable etchant gases contain chlorine, such as $BCl_3$, $Cl_2$, $CCl_4$, and $SiCl_4$. Other gases can be added for anisotropic etching, such as $ChCl_3$, $N_2$, $CHF_3$, and $C_2H_4$.

Figure 4A:
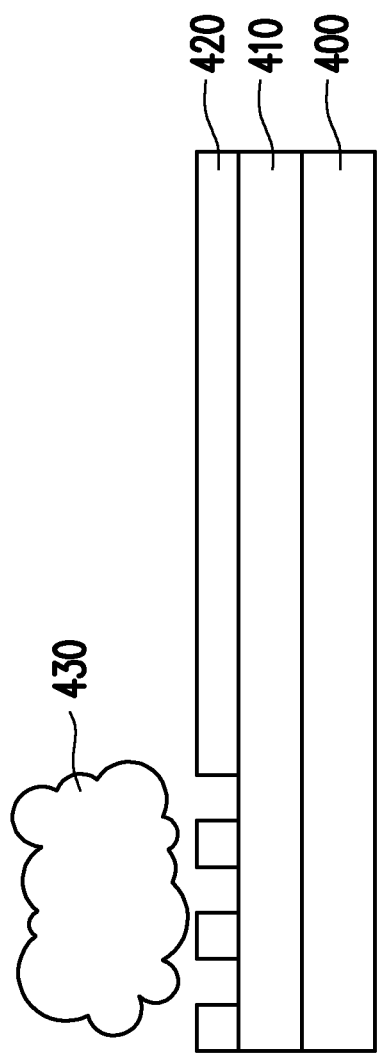
FIG. 4A and FIG. 4B are diagrams illustrating a dry etching process performed using a plasma treatment tool, in accordance with some embodiments.
Figure 4B:
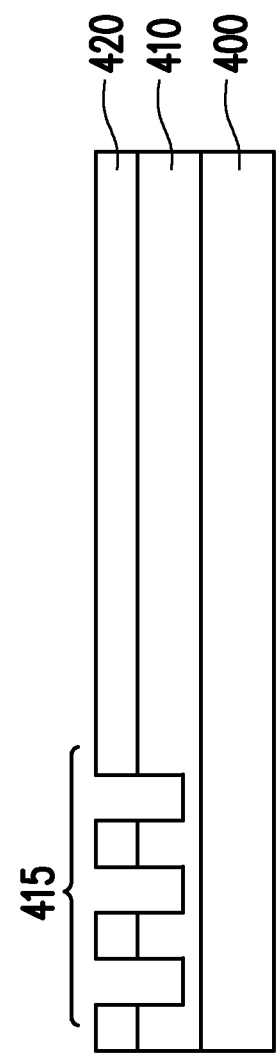

FIG. 4A and FIG. 4B are side cross-sectional views illustrating the dry etch process. In FIG. 4A, a metal layer 410 is present on a silicon substrate 400, and a photoresist layer 420 upon the metal layer has been patterned. The metal layer is then dry etched using plasma 430. Referring now to FIG. 4B, a trench 415 is present in the metal layer.

The plasma treatment tool can also be used for cleaning. The plasma treatment can remove contaminants from the surface of a wafer substrate. In addition, the surface is made hydrophilic by increasing the number of —OH groups on the surface, which may be beneficial for forming strong fusion bonds when wafer-to-wafer bonding is desired.

In dry etching processes, poor etch rate uniformity leads to defects that cannot be resolved with process adjustments. For example, this may arise because the dry etching tool has different pumping efficiencies across the wafer surface. The distribution of holes in the showerhead of the present disclosure is optimized according to the flow field distribution at steady state, when gas flow through each hole will be equal without regard to the location of the hole in the perforated plate. This provides the advantage of improving the uniformity of plasma flow across the entire surface of the wafer substrate, including the edges of the wafer. This results in decreased defects in the treated substrate and improved critical dimension/depth uniformity on the wafer.

Use of the showerhead of the present disclosure also leads to WAT/CP yield enhancement. In this regard, both WAT and CP are pass/fail tests. A given wafer can produce multiple chips, and each chip either passes or fails. The yield is the total percentage of chips that pass on a given wafer. Higher yield up to 100% is better. The systems and methods may be suitable for wafers having a pitch of 57 nm or less.

Some embodiments of the present disclosure thus relate to plasma treatment systems. The systems comprise a plasma generating chamber, a plasma treatment chamber below the plasma generating chamber, and a showerhead leading from the plasma generating chamber to the plasma treatment chamber. The showerhead comprises a perforated plate that comprises in sequence from a center of the perforated plate radially outward (i.e. concentrically): a primary solid zone, a first annular zone, a secondary solid zone, a second annular zone, a third annular zone, and a fourth annular zone. The primary solid zone has no holes. The first annular zone comprises a first plurality of holes with a first total hole area. The secondary solid zone has no holes. The second annular zone comprises a second plurality of holes with a second total hole area. The third annular zone comprises a third plurality of holes with a third total hole area. The fourth annular zone comprises a fourth plurality of holes with a fourth total hole area. The third total hole area is greater than the first total hole area and less than the second total hole area. The fourth total hole area is greater than the second total hole area.

Also disclosed in various embodiments are showerheads for a dry etch tool. The showerhead comprises a perforated plate and an outer sidewall extending normal to the perforated plate from a circumference of the perforated plate. The perforated plate has six concentric zones, as described above.

Also disclosed are dry etching methods. A plasma is generated in a plasma generating chamber. The plasma is then flowed through a showerhead to dry etch a substrate in a plasma treatment chamber. The showerhead includes a perforated plate with six concentric zones having a hole distribution as described above.

The methods and systems of the present disclosure are further illustrated in the following non-limiting working example, it being understood that the example is intended to be illustrative only and that the disclosure is not intended to be limited to the materials, conditions, process parameters and the like recited herein.

EXAMPLE

Figure 5:
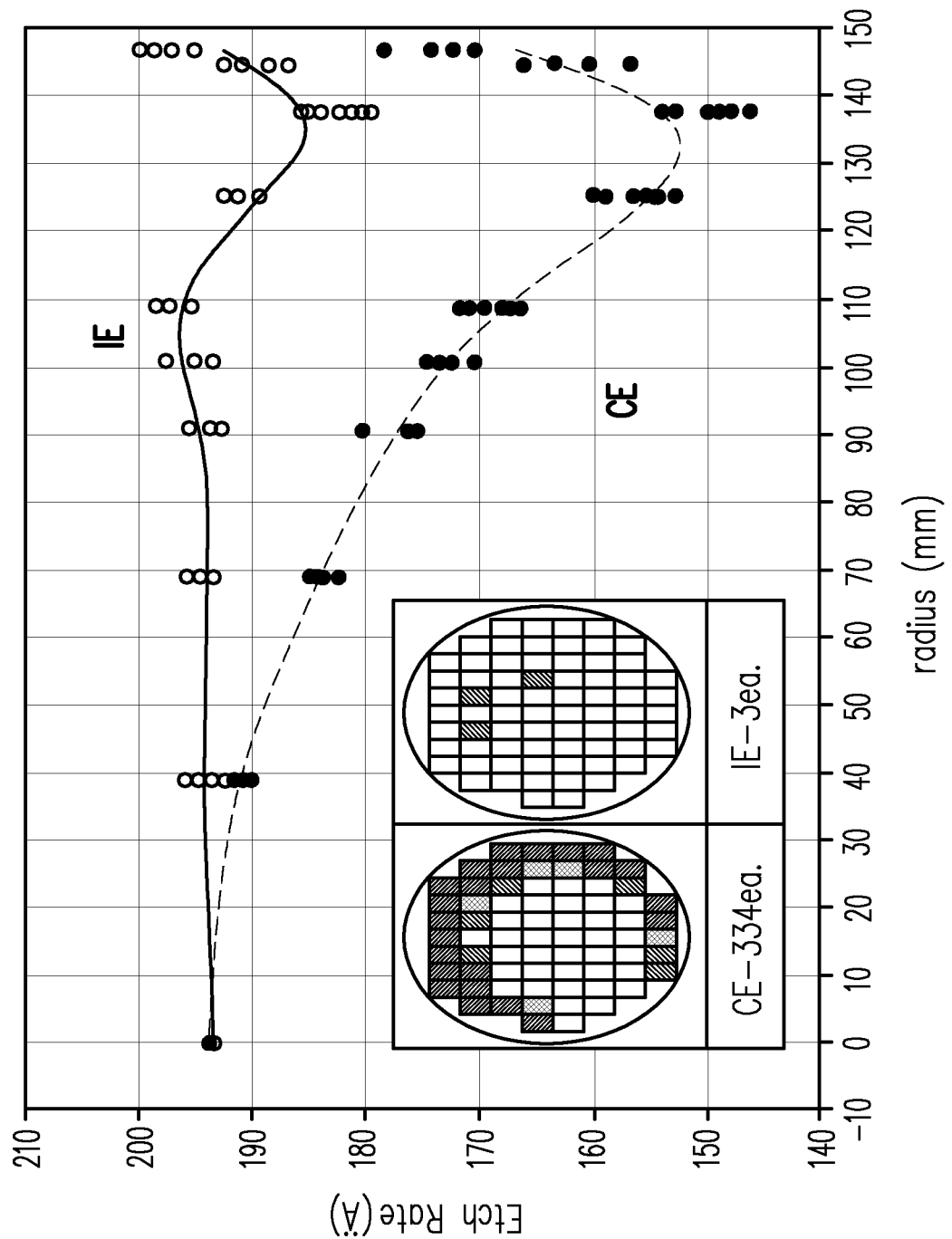
FIG. 5 is a graph and photograph showing experimental results between Comparative Examples and Inventive Examples.

Multiple wafer substrates were plasma treated off-line. In the Comparative Examples, labeled CE, a showerhead with a uniform hole distribution across its entire surface was used. In the Inventive Examples, labeled IE, a showerhead in accordance with the present disclosure was utilized. The results are illustrated in FIG. 5, which is a graph showing the etch rate (E/R) in angstroms versus the radius (in mm). Ideally, the result is a horizontal line. As seen here, the line labeled IE shows much less variation than the line labeled CE. The off-line E/R range improved by 67%. In further testing, the in-line E/R range improved by 79%. The two inset illustrations show the areas on the wafer substrates where defects were located, as well as a measure of the number of defects in those locations. The total number of defects decreased from 334 for the CE to only 3 for the IE, which is a 99% improvement. The large majority of defects for the CE were on the edges of the wafer, and those defects were almost entirely eliminated in the IE.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A plasma treatment system, comprising:
   a plasma generating chamber;
   a plasma treatment chamber below the plasma generating chamber; and
   a showerhead leading from the plasma generating chamber to the plasma treatment chamber;
   wherein the showerhead comprises a perforated plate that comprises in sequence from a center of the perforated plate radially outward:
   a primary solid zone having no holes;
   a first annular zone comprising a first plurality of holes with a first total hole area;
   a secondary solid zone having no holes;
   a second annular zone comprising a second plurality of holes with a second total hole area;
   a third annular zone comprising a third plurality of holes with a third total hole area; and
   a fourth annular zone comprising a fourth plurality of holes with a fourth total hole area; and
   wherein the third total hole area is greater than the first total hole area and less than the second total hole area, and the fourth total hole area is greater than the second total hole area.

2. The plasma treatment system of claim 1, wherein:
   the primary solid zone has an outer radius of about 3 mm to about 38 mm; or
   the first annular zone has an outer radius of 35 mm to about 53 mm; or
   the secondary solid zone has an outer radius of about 45 mm to about 68 mm; or
   the second annular zone has an outer radius of about 65 mm to about 98 mm; or
   the third annular zone has an outer radius of about 80 mm to about 120 mm; or
   the fourth annular zone has an outer radius of about 110 mm to about 150 mm.

3. The plasma treatment system of claim 1, wherein:
   the primary solid zone has a total area of about 300 $mm^2$ to about 900 $mm^2$; or
   the first annular zone has a total area of 1400 $mm^2$ to about 3600 $mm^2$; or
   the secondary solid zone has a total area of about 1100 $mm^2$ to about 2800 $mm^2$; or
   the second annular zone has a total area of about 4400 $mm^2$ to about 10700 $mm^2$; or
   the third annular zone has a total area of about 3300 $mm^2$ to about 8000 $mm^2$; or
   the fourth annular zone has a total area of about 15500 $mm^2$ to about 37400 $mm^2$.

4. The plasma treatment system of claim 1, wherein the holes in the perforated plate have a diameter of about 0.5 mm to about 13 mm.

5. The plasma treatment system of claim 1, wherein:
a first hole percentage of the first annular zone is from about 7% to about 11%; and
a second hole percentage of the second annular zone is from about 15% to about 24%; and
a third hole percentage of the third annular zone is from about 9% to about 14%; and
a fourth hole percentage of the fourth annular zone is from about 49% to about 69%.

6. The plasma treatment system of claim 1, wherein a total area of the primary solid zone and the secondary solid zone is less than about 3550 mm$^2$.

7. The plasma treatment system of claim 1, wherein the showerhead comprises aluminum or a ceramic material.

8. The plasma treatment system of claim 1, wherein the perforated plate further comprises an yttrium coating or a perfluoroalkoxy coating.

9. The plasma treatment system of claim 1, further comprising an ion filter located between the plasma generating chamber and the showerhead.

10. A showerhead for a dry etch tool, comprising a perforated plate and an outer sidewall extending normal to the perforated plate from a circumference of the perforated plate:
wherein the perforated plate comprises in sequence from a center of the perforated plate radially outward:
a primary solid zone having no holes;
a first annular zone having a first hole percentage of from about 7% to about 11%;
a secondary solid zone having no holes;
a second annular zone having a second hole percentage of from about 15% to about 24%;
a third annular zone having a third hole percentage of from about 9% to about 14%; and
a fourth annular zone having a fourth hole percentage of from about 49% to about 69%.

11. The showerhead of claim 10, wherein the third hole percentage is less than the first hole percentage, the second hole percentage, and the fourth hole percentage.

12. The showerhead of claim 10, wherein:
the primary solid zone has an outer radius of about 3 mm to about 38 mm; or
the first annular zone has an outer radius of 35 mm to about 53 mm; or
the secondary solid zone has an outer radius of about 45 mm to about 68 mm; or
the second annular zone has an outer radius of about 65 mm to about 98 mm; or
the third annular zone has an outer radius of about 80 mm to about 120 mm; or
the fourth annular zone has an outer radius of about 110 mm to about 150 mm.

13. The showerhead of claim 10, wherein:
the primary solid zone has a total area of about 300 mm$^2$ to about 900 mm$^2$; or
the first annular zone has a total area of 1400 mm$^2$ to about 3600 mm$^2$; or
the secondary solid zone has a total area of about 1100 mm$^2$ to about 2800 mm$^2$; or
the second annular zone has a total area of about 4400 mm$^2$ to about 10700 mm$^2$; or
the third annular zone has a total area of about 3300 mm$^2$ to about 8000 mm$^2$; or
the fourth annular zone has a total area of about 15500 mm$^2$ to about 37400 mm$^2$.

14. The showerhead of claim 10, wherein the holes in the perforated plate have a diameter of about 0.5 mm to about 13 mm.

15. The showerhead of claim 10, wherein the showerhead comprises aluminum or a ceramic material.

16. The showerhead of claim 10, wherein the perforated plate further comprises an yttrium coating or a perfluoroalkoxy coating.

17. The showerhead of claim 16, wherein the yttrium coating comprises an yttrium-containing material selected from the group consisting of yttrium fluoride (YF$_3$), yttrium oxyfluoride (YOF), and yttrium aluminum garnet (Y$_3$Al$_5$O$_{12}$).

18. The showerhead of claim 10, wherein the perforated plate has a thickness of about 10 mm to about 200 mm.

19. A showerhead for a dry etch tool, comprising a perforated plate and an outer sidewall extending normal to the perforated plate from a circumference of the perforated plate:
wherein the perforated plate comprises in sequence from a center of the perforated plate radially outward:
a primary solid zone having an outer radius of about 3 mm to about 38 mm and having no holes;
a first annular zone having an outer radius of 35 mm to about 53 mm and having a first total hole area;
a secondary solid zone having an outer radius of about 45 mm to about 68 mm and having no holes;
a second annular zone having an outer radius of about 65 mm to about 98 mm and having a second total hole area;
a third annular zone having an outer radius of about 80 mm to about 120 mm and having a third total hole area;
a fourth annular zone having an outer radius of about 110 mm to about 150 mm and having a fourth total hole area;
wherein the third total hole area is greater than the first total hole area and less than the second total hole area, and the fourth total hole area is greater than the second total hole area.

20. The showerhead of claim 19, further comprising an ion filter located between the plasma generating chamber and the showerhead.

* * * * *